(12) United States Patent
Farrow

(10) Patent No.: US 7,068,736 B2
(45) Date of Patent: Jun. 27, 2006

(54) METHODS AND DEVICES FOR SHORTENING THE CONVERGENCE TIME OF BLIND, ADAPTIVE EQUALIZERS

(75) Inventor: Cecil William Farrow, Highlands, NJ (US)

(73) Assignee: Agere Systems Inc., Allentown, PA (US)

( * ) Notice: Subject to any disclaimer, the term of this patent is extended or adjusted under 35 U.S.C. 154(b) by 670 days.

(21) Appl. No.: 09/902,160

(22) Filed: Jul. 11, 2001

(65) Prior Publication Data

US 2003/0012273 A1 Jan. 16, 2003

(51) Int. Cl.
*H03H 7/40* (2006.01)

(52) U.S. Cl. ............... 375/321; 375/232; 455/307

(58) Field of Classification Search ........... 375/229, 375/230, 231, 232, 233, 234, 346, 350; 708/322, 708/323; 455/296, 307
See application file for complete search history.

(56) References Cited

U.S. PATENT DOCUMENTS

| 5,608,804 A | * | 3/1997 | Hirano ............... 381/71.12 |
| 5,668,747 A | * | 9/1997 | Ohashi ............... 708/322 |
| 5,790,440 A | * | 8/1998 | Fujii et al. ............ 708/322 |
| 6,366,613 B1 | * | 4/2002 | Sommer et al. ........ 375/232 |

* cited by examiner

*Primary Examiner*—Dac V. Ha

(57) ABSTRACT

The convergence time of a blind, adaptive equalizer is shortened by using a tracking generator. The tracking generator comprises a smoothing filter which receives and smoothes a tap coefficient error estimate derived from an output data stream. Thereafter, a fraction of the smoothed estimate is generated. It is the use of this function of the smoothes estimate which allows the convergence time to be shortened.

17 Claims, 1 Drawing Sheet

METHODS AND DEVICES FOR SHORTENING THE CONVERGENCE TIME OF BLIND, ADAPTIVE EQUALIZERS

BACKGROUND OF THE INVENTION

Data sent through a channel is subject to linear distortion as well as other impairments. An "equalizer" is a device which is used to remove, or reduce (hereafter collectively referred to as "compensate") linear distortion and is commonly made a part of a receiver.

One type of equalizer is called an "adaptive" equalizer. Adaptive equalizers comprise "tap coefficients" that are continuously adjusted, with the goal of producing an error free (i.e., distortion-free) output signal.

Adaptive equalizers typically operate in various modes, two of which are a "decision directed" and "blind" mode.

Decision directed, adaptive equalizers make use of an "ideal" reference signal. For example, a pseudo-random sequence may be used as an ideal reference. Sometimes, however, it is not practical to use an ideal reference. Blind, adaptive equalizers may then be used. Such equalizers use a "fixed" reference. The value of the fixed reference always remains the same as compared with an ideal reference, whose value may change randomly. Both decision directed and blind adaptive equalizers require a "start-up time". It has been known for some time that adaptive equalizers require a certain start-up time before they can be used to accurately receive and recreate data. This time is called a "convergence time". Typically, decision directed, adaptive equalizers have shorter convergence times than blind adaptive equalizers. This is due to the fact that a decision directed, adaptive equalizer's tap coefficients may be adjusted in large increments without creating a large deviation from a mean (i.e., statistical mean) error. In contrast, the tap coefficients of a blind, adaptive equalizer must be incremented in very small amounts resulting in equalizers which take 100 times as long (i.e., two orders of magnitude longer) to reach convergence than decision directed, adaptive equalizers. Efforts to date to increment tap coefficients of a blind, adaptive equalizer in relatively large increments have not proven successful. Existing techniques inherently generate too much noise, which prevents an equalizer from reaching convergence.

It is believed that the convergence time of existing blind, adaptive equalizers takes longer than necessary.

It is therefore a desire of the present invention to provide for methods and devices which shorten the time it takes for blind, adaptive equalizers to reach convergence.

SUMMARY OF THE INVENTION

In accordance with the present invention, methods and devices are provided for shortening the convergence time of blind, adaptive equalizers. As envisioned by the present invention, an equalizer comprises a tracking generator. During a start-up period, the tracking generator receives and smoothes tap coefficient error estimates derived from an output data stream. The generator then generates a fractional error from the smoothed, tap coefficient error estimates. Even though only a fraction of the smoothed error estimates are used, the adjustments made to tap coefficients are larger than previously thought possible.

These larger adjustments shorten the time needed by a blind, adaptive equalizer to reach convergence as compared to existing equalizers.

DETAILED DESCRIPTION OF THE INVENTION

Figure 1:
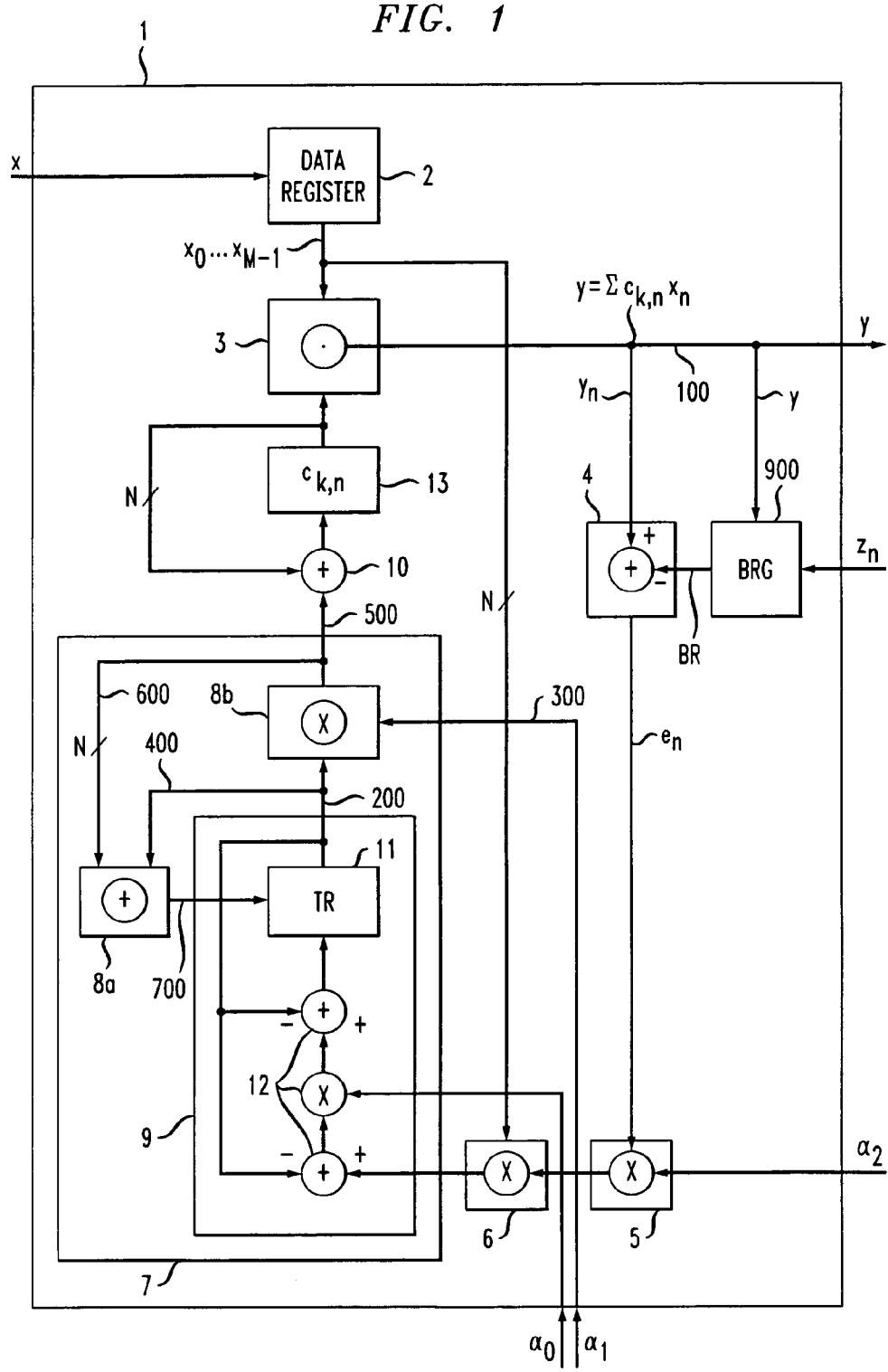
FIG. 1 depicts a simplified block diagram of a blind, adaptive equalizer according to one embodiment of the present invention.

The present invention envisions blind, adaptive equalizers which are adapted to reach convergence using relatively large adjustments to tap coefficients. This equates to reducing the time (e.g., by at least one order of magnitude) it takes for a blind, adaptive equalizer (hereafter "equalizer" unless otherwise noted) to reach convergence compared to existing techniques.

Referring now to FIG. 1, there is shown a simplified, high-level block diagram of a blind, adaptive equalizer 1 according to one embodiment of the present invention. Equalizer 1 may comprise one or more integrated circuits, discrete devices, or programmed media (e.g., digital signal processor, emulator or the like adapted to store one or more software programs) adapted to carry out the features and functions of the present invention.

In an illustrative embodiment of the present invention, equalizer 1 comprises: data register or sampling unit 2, output data stream or signal generator 3, equalizer error generator or unit 4, level adjustment unit 5, coefficient error estimator or unit 6, tracking generator 7 and coefficient generator or unit 10. In one embodiment of the present invention, the tracking generator 7 comprises an exponential smoothing unit or filter 9 and tracking adjustment units 8$a$, 8$b$ (hereinafter collectively referred to as "tracking adjustment unit"). The smoothing filter 9 in turn comprises a series of adders and multipliers (symbolized by the circles enclosing "+" and "x" in FIG. 1) 12 and an error storage unit or tracking memory 11 (identified by the letters "TR" in FIG. 1). The operation of equalizer 1 will now be described in more detail.

At preselected clock intervals "n", equalizer 1 is adapted to generate a received output data stream or signal $y_n$ via pathway 100 from an input data stream or signal x by applying tap coefficients $c_0$, $c_1$, $c_2$ $c_{m-1}$ (collectively $c_{k,n}$, and indicated by coefficient storage unit 13 in FIG. 1) received from coefficient generator 10 to sampled outputs $x_0$, $x_1$ $x_2 \ldots x_{M-1}$ (collectively, $x_n$) where "M" corresponds to the total number of "taps", or sampling stages of data register 2.

At the beginning of a start-up period, the output data stream $y_n$ will not be an accurate copy of the original transmitted data stream. Said another way it is the output data stream, $y_n$, which must converge before the equalizer 1 can be relied upon to correctly recover the input data stream x.

In an illustrative embodiment of the present invention, equalizer 1 reaches convergence as follows.

Upon receiving data samples $x_n$ from data register 2 and coefficient factors $c_{k,n}$ from coefficient generator 10, the signal generator 3 generates the "dot" product of each output $x_n$ and coefficient $c_n$ (symbolized by the circle enclosing a "." in FIG. 1), to sum all of these data signals and to generate output signal $y_n$.

Assuming at this point that the output signal $y_n$ remains an inaccurate copy of the input signal x, (i.e., data stream) errors present in tap coefficients 13 must be reduced. In an illustrative embodiment of the present invention, the generator 3 forwards the output signal $y_n$ to equalizer error generator 4 at the end of each "symbol" period (e.g., typically equal to 4 sampling periods). Generator 4 thereafter generates an equalizer output error, $e_n$, by subtracting a "blind reference" signal "BR" derived from a reference z supplied by a blind reference generator ("BRG") 900. The error $e_n$ is an indication of how close or how far from convergence the output signal or data stream $y_n$ is at the end of a given symbol period.

In one embodiment of the present invention, the reference signal BR may comprise z times the SGN (y).

Upon generating the error $e_n$, the generator 4 sends it to the level adjustment unit 5. In one embodiment of the present invention, the adjustment unit 5 multiplies the error with an adjustment factor, $\alpha_2$. Generally, the adjustment factor $\alpha_2$ is derived from the inverse of the average power of all of the signal samples, $x_n$.

After combining the error with the adjustment factor $\alpha_2$, the unit 5 generates an "adjusted" equalizer error ("adjusted error") and forwards the adjusted error to the coefficient error estimator 6. The estimator 6 multiplies the adjusted error with each of the data samples $x_n$ in order to generate and output one or more tap coefficient error estimates ("estimated error"). This error is then sent to the tracking generator 7.

It should be understood that though only a single output from the error estimator 6 and single input into the tracking generator 7 is shown in FIG. 7, the invention is not so limited. In fact, the estimator 6 will typically output a plurality of outputs (i.e., "N outputs"). Similarly, tracking generator 7 typically comprises a plurality of tracking generators.

Existing equalizers (e.g., decision-directed equalizers) would attempt to use this estimated error to generate new tap coefficients $c_n$. That is, this error would typically be sent to the coefficient generator 10 which would then generate new coefficients. These coefficients would subsequently be used to generate a new output signal, $y_{n+1}$. In the case of a blind, adaptive equalizer the estimated error, however, is too large. Said another way, the estimated error output by unit 6 comprises a large noise component. Generating new tap coefficients using such a "noisy" error will fail to reduce the standard deviation of the error to a small enough value so that the equalizer 1 can converge. Instead, a noisy error only generates a noisy output signal $y_n$.

Realizing this, the present invention envisions an equalizer 1 which comprises a tracking generator 7 adapted to generate and output a fraction of the error estimate (hereafter referred to as a "fractional error").

In an illustrative embodiment of the present invention, the generator 7 comprises smoothing filter 9 and tracking unit 8a, 8b. The smoothing filter 9 is adapted to receive the error estimate and to generate an "averaged, smoothed" error (hereafter "smoothed error"). More specifically, adders and multipliers 12 are adapted to generate the smoothed error by processing the error estimate in combination with a smoothing factor, $\alpha_0$. Thereafter, the memory 11 is adapted to store the smoothed error.

Once the smoothed error is stored, it is sent to tracking adjustment unit 8a, 8b. It is this unit which generates the fractional error. In an illustrative embodiment of the present invention, the unit 8b is adapted to receive the smoothed error via pathway 200 and a coefficient adjustment factor $\alpha_1$ via pathway 300. The unit 8b is further adapted to multiply these two values together ( . . . for example . . . ) to generate a fractional error. It should be understood that, by controlling the value of the coefficient adjustment factor $\alpha_1$, the value of the fractional error may also be controlled. That is, the larger the value of $\alpha_1$, the greater the value of the fractional error and vice-versa. The coefficient adjustment factor may be any value desired, such as $2^{-8}$ or $\frac{1}{256}$, for example.

Once the fractional error has been generated, the unit 8b outputs it to the coefficient generator 10 via pathway 500 and to unit 8a via pathway 600. Unit 8a subtracts the fractional error from the stored, smoothed error received via pathway 400 in order to generate a new, smoothed error or reduced error. This reduced error is sent to memory 11 via pathway 700. During the next sampling period, the tracking generator 7 will generate a new or "next" fractional error based on this reduced error. Thus, it can be said that the generator 7 is adapted to subtract an error value which is equal to the value output to coefficient generator 10. Because the generator 7 reduces the smoothed error each time a fractional error is output, the generator 7 can be said to "track" the smoothed error.

Because only a fraction of the smoothed, coefficient error estimate is sent to the coefficient generator 10, only a fraction of the noise is passed on as well. In sum, the new coefficients generated by generator 10 are less noisy than would ordinarily be expected.

Completing the cycle, upon receiving the fractional error via pathway 500, the coefficient generator 10 generates new, adjusted tap coefficients, $c_{n+1}$ by combining (e.g., multiplying) the existing coefficients by the fractional error.

During the next sampling period, the generator 10 (or storage unit 13) outputs new, adjusted tap coefficients to output signal generator 3. Thereafter, generator 3 combines the adjusted tap coefficients with the next signal samples, $x_{n+1}$. Eventually, the equalizer is adapted to output a next output signal, $y_{n+1}$ after the next symbol period. From here, the process continues as described above (i.e., new fractional errors are generated which generate new, adjusted tap coefficients) for as many cycles or iterations until the output $y_n$ reaches convergence. There are any number of ways that a convergence point or range may be detected. For example, one way is to measure the equalizer output error $e_n$, process it (e.g., square its value and then apply the new value to an exponential smoothing filter) and then measure whether the value of $e_n$ falls below a threshold. If so, the equalizer output $y_n$ can be said to have converged.

The discussion above includes examples or embodiments which may be used to carry out the features and functions of the present invention. Others may be envisioned. For example, after the equalizer 1 reaches convergence, it may be adapted to operate as a decision-directed equalizer by forwarding the adjusted equalizer error directly from unit 5 to coefficient generator 10. In addition, though shown as separate units. some or all of units 1–13 maybe us combined into fewer units or further broken down into additional units.

It should be understood that although only a fraction of each smoothed coefficient error is used, each fraction results in the generation of new coefficients in increments which are at least one order of magnitude larger than generated by existing blind, adaptive equalizers. Because relatively larger increments are used, equalizers envisioned by the present invention reach convergence faster than existing blind, adaptive equalizers.

It should be understood that variations may be made by those skilled in the art without departing from the spirit and the scope of the present invention as defined by the claims which follow.

I claim:

1. A blind, adaptive equalizer comprising:
a coefficient generator for adjusting a tap coefficient; and
a tracking generator, wherein the tracking generator comprises
   a smoothing filter for receiving a tap coefficient error estimate associated with a data sample of an input data stream and for generating a smoothed error from the tap coefficient error estimate wherein the tap coefficient error estimate is generated by multiplying an adjusted equalizer error with the data sample; and
   a tracking unit for generating a fractional error from the smoothed error, the coefficient generator adjusting the tap coefficient based on the fractional error.

2. The equalizer as in claim 1 wherein the tracking generator further generates a reduced error by subtracting the fractional error from a stored smoothed error.

3. The equalizer as in claim 2 wherein the tracking generator further generates a fraction of the reduced error.

4. The equalizer as in claim 1 wherein the tracking generator further generates the smoothed error from the tap coefficient error estimate and a smoothing factor.

5. The equalizer as in claim 1 wherein during a start up period, the coefficient generator receives existing tap coefficients and fractional errors associated with the data samples of the input data stream and adjusts the existing tap coefficients based on the fractional errors.

6. The equalizer as in claim 1 further comprising an output unit for generating a converged output signal.

7. The equalizer as in claim 1 wherein the tracking generator further generates the fractional error based on the smoothed error and a coefficient adjustment factor.

8. The equalizer as in claim 7 wherein the adjustment factor is 1/256.

9. The equalizer as in claim 1 wherein the tracking generator comprises a programmed medium.

10. A method for shortening the convergence time of blind adaptive equalizers comprising:
receiving a tap coefficient error estimate of an input data stream, wherein the tap coefficient error estimate is generated by multiplying an adjusted equalizer error with a data sample;
generating a smoothed error from the estimate;
generating a fractional error from the smoothed error; and
adjusting a tap coefficient in a coefficient generator according to the fractional error.

11. The method as in claim 10 further comprising generating a reduced error by subtracting the fractional error from a stored, smoothed error.

12. The method as in claim 11 further comprising generating a fraction of the reduced error.

13. The method as in claim 10 further comprising generating the smoothed error from the tap coefficient error estimate and a smoothing factor.

14. The method as in claim 10 further comprising:
receiving initial tap coefficient values and fractional errors associated with the data samples of the input data stream; and
adjusting the initial tap coefficients based on the fractional errors.

15. The method as in claim 10 further comprising generating a converged output signal.

16. The method as in claim 10 further comprising generating the fractional error based on the smoothed error and a coefficient adjustment factor.

17. The method as in claim 16 wherein the adjustment factor is 1/256.

* * * * *